US008045377B2

(12) United States Patent
Kim

(10) Patent No.: US 8,045,377 B2
(45) Date of Patent: Oct. 25, 2011

(54) NON-VOLATILE MEMORY WITH DYNAMIC MULTI-MODE OPERATION

(75) Inventor: Jin-Ki Kim, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 22 days.

(21) Appl. No.: 12/635,280

(22) Filed: Dec. 10, 2009

(65) Prior Publication Data

US 2010/0174854 A1 Jul. 8, 2010

Related U.S. Application Data

(63) Continuation of application No. 11/829,410, filed on Jul. 27, 2007, now Pat. No. 7,646,636.

(60) Provisional application No. 60/890,252, filed on Feb. 16, 2007.

(51) Int. Cl.
*G11C 16/04* (2006.01)

(52) U.S. Cl. ............... 365/185.03; 365/185.12; 365/168

(58) Field of Classification Search ............ 365/185.01, 365/185.03, 185.11, 185.12, 185.17, 185.33
See application file for complete search history.

(56) References Cited

U.S. PATENT DOCUMENTS

| 5,163,021 | A | 11/1992 | Mehrotra et al. |
| 5,299,162 | A | 3/1994 | Kim et al. |
| 5,367,484 | A | * 11/1994 | Alexander et al. ....... 365/185.09 |
| 5,541,879 | A | 7/1996 | Suh et al. |
| 5,546,341 | A | 8/1996 | Suh et al. |
| 5,671,178 | A | 9/1997 | Park et al. |
| 5,671,388 | A | 9/1997 | Hasbun |
| 5,822,256 | A | 10/1998 | Bauer et al. |
| 5,835,935 | A | 11/1998 | Estakhri et al. |
| 6,097,637 | A | 8/2000 | Bauer et al. |
| 6,107,658 | A | 8/2000 | Itoh et al. |
| 6,118,705 | A | 9/2000 | Gupta et al. |
| 6,230,233 | B1 | 5/2001 | Lofgren et al. |
| 6,359,810 | B1 | 3/2002 | Gupta et al. |

(Continued)

FOREIGN PATENT DOCUMENTS

EP 1343172 A2 9/2003

OTHER PUBLICATIONS

Aritome, et al., "A Reliable Bi-Polarity Write/Erase Technology in Flash Eeproms", Int'l. Electron Devices Meeting, 1990, Technical Digest, Dec. 9-12, 1990; pp. 111-114.

(Continued)

*Primary Examiner* — Gene N. Auduong
(74) *Attorney, Agent, or Firm* — Shin Hung; Borden Ladner Gervais LLP

(57) ABSTRACT

A method and system for extending the life span of a flash memory device. The flash memory device is dynamically configurable to store data in the single bit per cell (SBC) storage mode or the multiple bit per cell (MBC) mode, such that both SBC data and MBC data co-exist within the same memory array. One or more tag bits stored in each page of the memory is used to indicate the type of storage mode used for storing the data in the corresponding subdivision, where a subdivision can be a bank, block or page. A controller monitors the number of program-erase cycles corresponding to each page for selectively changing the storage mode in order to maximize lifespan of any subdivision of the multi-mode flash memory device.

30 Claims, 15 Drawing Sheets

U.S. PATENT DOCUMENTS

| | | | |
|---|---|---|---|
| 6,456,528 | B1 | 9/2002 | Chen |
| 6,594,183 | B1 | 7/2003 | Lofgren et al. |
| 6,717,847 | B2 | 4/2004 | Chen |
| 6,728,133 | B2 | 4/2004 | Shimizu |
| 6,732,221 | B2 | 5/2004 | Ban |
| 6,807,106 | B2 | 10/2004 | Gonzales et al. |
| 6,847,550 | B2 | 1/2005 | Park |
| 6,850,443 | B2 | 2/2005 | Lofgren et al. |
| 6,885,583 | B2 | 4/2005 | Tanaka |
| 7,082,056 | B2 | 7/2006 | Chen et al. |
| 7,111,140 | B2 | 9/2006 | Estakhri et al. |
| 7,161,842 | B2 | 1/2007 | Park |
| 7,308,525 | B2 | 12/2007 | Lasser et al. |
| 7,336,531 | B2 | 2/2008 | Roohparvar |
| 7,433,246 | B2 | 10/2008 | Lee |
| 7,508,732 | B2 | 3/2009 | Park et al. |
| 7,554,842 | B2 | 6/2009 | Barzilai et al. |
| 7,593,259 | B2 | 9/2009 | Kim |
| 7,646,636 | B2 * | 1/2010 | Kim ............... 365/185.03 |
| 7,804,718 | B2 * | 9/2010 | Kim ............... 365/185.29 |
| 7,836,242 | B2 * | 11/2010 | Hwang et al. ............ 711/103 |
| 2004/0080979 | A1 | 4/2004 | Park |
| 2005/0007801 | A1 | 1/2005 | Barzilai et al. |
| 2005/0180209 | A1 | 8/2005 | Lasser |
| 2005/0286297 | A1 | 12/2005 | Roohparvar |
| 2006/0004952 | A1 | 1/2006 | Lasser |
| 2006/0050594 | A1 | 3/2006 | Park |
| 2006/0133155 | A1 | 6/2006 | Fujita et al. |
| 2006/0282610 | A1 * | 12/2006 | Dariel et al. ............ 711/103 |
| 2007/0025151 | A1 | 2/2007 | Lee |
| 2008/0062760 | A1 | 3/2008 | Kim |
| 2008/0077728 | A1 | 3/2008 | Kim et al. |

OTHER PUBLICATIONS

Shirota, et al., "A 2.3 um2 Memory Cell Structure for 16Mb Nand Eeproms", International Electron Device Meeting Tech. Dig., Dec. 1990, pp. 103-106.

Hara, et al., "A 146mm2 8Gb NAND Flash Memory with 70nm CMOS Technology", IEEE Journal of Solid State Circuits, vol. 41, No. 1, Jan. 2006, pp. 161-169.

Byeon, et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 7, 2005, pp. 46-47.

Suh, et al., "A 3.3 V 32 Mb NAND Memory with Incremental Step Pulse Programming Scheme", IEEE Journal of Solid-State Circuits, vol. 30, No. 11, Nov. 1995, pp. 1149-1156.

Takeuchi, et al., "A Multipage Cell Architecture for High-Speed Programming Multilevel NAND Flash Memories", IEEE Journal of Solid-State Circuits, vol. 33, No. 8, Aug. 1998, pp. 1228-1238.

Jung, et al., "A 117-mm2 3.3-V Only 128-Mb Multilevel NAND Flash Memory for Mass Storage Applications", IEEE Journal of Solid-State Circuits, vol. 31, No. 11, Nov. 1996, pp. 1575-1583.

Cho, et al., "A Dual-Mode Nand Flash Memory: 1-Gb Multilevel and High Performance 512-Mb Single-Level Modes", IEEE Journal of Solid-State Circuits, vol. 36, No. 11, Nov. 2001, pp. 1700-1706.

Lee, et al., "A 3.3V 4Gb Four-Level NAND Flash Memory with 90nm CMOS Technology", 2004 IEEE International Solid-State Circuits Conference, Session 2, Feb. 16, 2004, ten (10) pages, vol. 1.

Takeuchi, et al., "A 56nm CMOS 99mm2 8Gb Multi-Level NAND Flash Memory with 10MB/s Program Throughput", 2006 IEEE International Solid-State Circuits Conference, Session 7, Feb. 6, 2004, pp. 507-516.

Samsung Electronics, "256M x 8 Bit /128M x 16 Bit/512M x 8 Bit NAND Flash Memory", May 6, 2005, pp. 1-41.

Gal et al., "Algorithms and Data Structures for Flash Memories", ACM Computing Surveys, vol. 37, No. 2, Jun. 2005, pp. 138-163.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kirisawa, et al., A Nand Structured Cell With a New Programming Technology for Highly Reliable 5V-Only Flash Eeprom, 1990 IEEE Symposium on VLSI Tech., Jun. 4-7, 1990, pp. 129-130.

International Patent Application No. PCT/CA2008/000285, Search Report dated May 28, 2008, p. 2.

Kim, et al. "A 120-mm2 64 Mb NAND Flash Memory Archieving 180 ns/Byte Effective Program Speed," IEEE Journal of Solid-State Circuits, vol. 32, No. 5, May 1997, pp. 670-680.

Tanaka, T. et al., "A quick intelligent page-programming architecture and a shielded bitline sensing method for 3 V only NAND flash memory", IEEE Journal of Solid-state Circuits, vol. 29, Issue 11, Nov. 1994, pp. 1366-1373.

Samsung Electronics Co. Ltd, "1G x 8 Bit/2G x 8 Bit NAND Flash Memory", K9F8G08UXM, Mar. 31, 2007, pp. 1-54.

Choi, Young, "16-Gbit MLC NAND Flash Weighs in", EETimes. com, Jul. 7, 2007, pp. 1-3, http://www.eetimes.com/ showArticle.jhtmlarticleID=201200825.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G x 8 Bit NAND Flash Memory", K9GAG08U0M, Apr. 12, 2006, pp. 1-48.

Toshiba, "16 Gbit (2G x 8 Bit) CMOS NAND E2PROM (Multi-Level-Cell)", TC58NVG4D1DTG00, Nov. 9, 2006.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, Jul. 2005.

Intel Corporation, "Intel Strataflash Wireless Memory (L18)", Order No. 251902, Revision 010, Aug. 2005.

Jung et al., "A 3.3V 128Mb Multi-Level NAND Flash Memory for Mass Storage Applications," 1996 IEEE International Solid-State Circuits Conference, Digest of Technical Papers, Feb. 1996, pp. 32-33.

Cho, et al., "A 3.3 V 1 Gb Multilevel NAND Flash Memory with Non-Uniformthreshold Voltage Distribution", Solid State Circuits Conference, 2001, Digest of Technical Papers, ISSCC, 2001 IEEE International, Feb. 5, 2001, pp. 28-29.

U.S. Appl. No. 11/829,410, Notice of Allowance dated Nov. 17, 2009.

Spansion Data Sheet, S70GL01GN00 MirrorBitFlash 1024 Megabit, 3.0 Volt-only Page Mode Flash Memory Featuring 110 mm MirrorBit Process Technology, Jun. 1, 1995.

\* cited by examiner

NON-VOLATILE MEMORY WITH DYNAMIC MULTI-MODE OPERATION

CROSS REFERENCE TO RELATED APPLICATIONS

This application is a Continuation Application from U.S. patent application Ser. No. 11/829,410, filed Jul. 27, 2007, now issued as U.S. Pat. No. 7,646,636, which claims the benefit of priority to, U.S. Provisional Patent Application No. 60/890,252 filed on Feb. 16, 2007, which is incorporated herein by reference in its entirety.

BACKGROUND

Flash memory is a commonly used type of non-volatile memory in widespread use as mass storage for consumer electronics, such as digital cameras and portable digital music players for example. The density of a widely available flash memory chip can be up to 4 GB (at present) which is suitable for use in popular USB flash drives since the size of one flash chip is small.

The advent of 8 mega pixel digital cameras and portable digital entertainment devices with music and video capabilities has spurred demand for ultra-high capacities to store the large amounts of data, which cannot be met by the single flash memory device. Therefore, multiple flash memory devices are combined together into a memory system to effectively increase the available storage capacity. For example, flash storage densities of 20 GB may be required for such applications. Higher density systems can be realized for hard disk drive (HDD) applications.

FIG. 1 is a general block diagram of typical flash memory of the prior art. Flash memory 10 includes logic circuitry such as control circuit 12, for controlling various functions of the flash circuits, registers for storing address information, data information and command data information, high voltage circuits for generating the required program and erase voltages, and core memory circuits for accessing the memory array 14. The control circuit 12 includes a command decoder and logic for executing the internal flash operations, such as read, program and erase functions. The functions of the shown circuit blocks of flash memory 10 are well known in the art. Persons skilled in the art will understand that flash memory 10 shown in FIG. 1 represents one possible flash memory configuration amongst many possible configurations.

The memory cell array 14 of the flash memory 10 of FIG. 1 consists of any number of banks, which is a selected design parameter for a particular flash device. FIG. 2 is a schematic illustration showing the organization of one bank 20 of the memory cell array 14 of FIG. 1. Bank 20 is organized into k+1 blocks, and each block consists of i+1 pages. Both k and i are integer values. Each page corresponds to a row of memory cells coupled to a common wordline. A detailed description of the memory cells of the block follows.

Each block consists of NAND memory cell strings, having up to i+1 flash memory cells 22 serially arranged and electrically coupled to each other. Accordingly, wordlines $WL_0$ to $WL_i$ are coupled to the gates of each flash memory cell in the memory cell string. A string select device 24 coupled to signal SSL (string select line) selectively connects the memory cell string to a bitline 26, while a ground select device 28 coupled to signal GSL (ground select line) selectively connects the memory cell string to a source line, such as VSS. The string select device 24 and the ground select device 28 are n-channel transistors.

There are j+1 bitlines 26 common to all blocks of bank 20, and each bitline 26 is coupled to one NAND memory cell string in each of blocks [0] to [k]. Variable j is an integer value. Each wordline ($WL_0$ to $WL_i$), SSL and GSL signal is coupled to the same corresponding transistor device in each NAND memory cell string in the block. As those skilled in the art should be aware, data stored in the flash memory cells along one wordline is referred to as a page of data.

Coupled to each bitline outside of the bank 20 is a data register 30 for storing one page of write data to be programmed into one page of flash memory cells. Data register 30 also includes sense circuits for sensing data read from one page of flash memory cells. During programming operations, the data registers perform program verify operations to ensure that the data has been properly programmed into the flash memory cells coupled to the selected wordline. Programming within a block typically starts at the page corresponding to $WL_0$, and proceeds sequentially up to $WL_i$ to fill the present block. Alternately, programming can start at $WL_i$ and proceed sequentially down to $WL_0$. Then programming continues with $WL_0$ of a new block. Within a device, blocks are typically programmed in sequence.

The flash cells of flash memory 10 can store data in one of two different modes. Data can be stored in a single bit per cell (SBC) storage mode or a multiple bit per cell (MBC) storage mode. In the SBC storage mode, exactly one bit of information is stored in one cell to represent one of two possible states. In the MBC storage mode, two bits are stored in one cell to represent one of four possible states. Of course, three bits or more can be stored in one cell, but the example of having two bits stored in one cell will be used from this point forward. The advantage of storing data in the MBC storage mode (two bits per cell or more) is the at least doubling of storage capacity over the SBC storage mode when using the same number of cells. The main circuits of the flash memory 10 are substantially the same when storing data in the SBC storage mode or the MBC storage mode. Therefore, flash memory manufacturers apply a mask option during the fabrication process to configure the flash memory 10 to execute either SBC specific algorithms or MBC specific algorithms, since the flash circuits are controlled differently between SBC and MBC read and program operations.

FIG. 3 shows a threshold voltage (Vt) distribution graph for erased memory cells and programmed memory cells in the SBC storage mode. Due to process and voltage supply variations, the erased and programmed threshold voltages are distributed within a voltage range. As shown in FIG. 3, erased memory cells have a negative threshold voltage between −3V to −1V, while programmed memory cells have a positive threshold voltage between 1V and 3V. The ranges depend on the desired threshold voltage for the memory cells. The threshold voltage ranges are illustrative of possible threshold voltages that can be used in a particular flash memory device, however those skilled in the art will understand that the selection of threshold voltages to use for erased and programmed memory cells will depend on the design and manufacturing process of the flash memory device. Persons skilled in the art will understand that different flash devices will have different threshold voltage ranges to suit a particular design or application.

FIG. 4 shows a threshold voltage (Vt) distribution graph for erased memory cells and programmed memory cells in the MBC storage mode. Erased memory cells have a negative threshold voltage, and there are three ranges of positive threshold voltages that the memory cell will store, each corresponding to a different state. Preferably, the min and max ranges of threshold voltages for each state should be minimized, while the spacing between the ranges should be maximized.

It is well known that flash memory devices have a limited number of erase-program cycles before they can no longer be used to store data reliably. More specifically, flash memory cells are subject to program/erase cycle wearing, which is a progressive degradation of a flash memory cell due to cumulative program and erase operations. It is noted that a memory block is always erased first prior to being programmed with data, hence the cycles can be referred to as both program and erase cycles. It is the understanding of those skilled in the art that all currently known flash memory is configured for block erase, meaning that if just one page of data in a block is to be modified, the entire block containing that page is erased and re-programmed with the modified page and the unmodified pages. The effect of such cumulative program and erase operations is the alteration of the program and erase characteristics of the memory cell beyond optimal parameters. When memory cells are degraded, higher program and erase voltages are needed to program or erase the memory cells to the desired threshold voltages. Eventually, the memory cells will fail to retain data (ie. desired threshold voltage) properly. For example, the typical rated erase-program cycles for current SBC flash memory is about 100,000 cycles. However, current MBC flash memory has a smaller rated limit 10,000 cycles. The above mentioned erase-program cycle limits are examples only, but it is well understood that MBC erase-program cycles are lower by a significant factor over SBC erase-program cycles.

Currently, most flash memory available is of the MBC type due to the large storage density relative to its chip size. While this is suitable for most consumer applications, the 10,000 cycle program-erase limit may be insufficient for other applications where data programming and erasing is frequent. Therefore, when an MBC flash memory has reached its 10,000 cycle life span, it is no longer usable and must be discarded. This problem is more critical for commercial applications, such as HDD applications, where there are more frequent program-erase cycles. Because HDD applications require higher data integrity than most consumer applications, MBC flash memory is not suited for use due to its relatively short 10,000 cycle life span.

It is, therefore, desirable to provide a flash memory and flash memory system suitable for both consumer and commercial applications, having an extended life span.

SUMMARY

It is an aspect of the present embodiments to obviate or mitigate at least one disadvantage of previous flash memory systems.

In a first aspect, there is provided flash memory device having a memory array. The flash memory device includes a command decoder, a control logic circuit, and flash memory circuitry for programming memory cells. The command decoder issues one of a multiple bit per cell (MBC) program command and a single bit per cell (SBC) program command in response to an external program command. The control logic circuit executes a programming algorithm in response to either the multiple bit per cell program command or the single bit per cell program command. The flash memory circuitry programs memory cells of the memory array in response to the programming algorithm. According to an embodiment of the present aspect, the command decoder includes an SBC command decoder for issuing the SBC program command, and an MBC command decoder for issuing the MBC program command.

In another embodiment of the present aspect, the memory array includes first subdivisions configured for storing data in an MBC storage mode in response to the MBC program command, and second subdivisions configured for storing data in an SBC storage mode in response to the SBC program command. The first subdivisions and the second subdivisions can include memory blocks or memory pages. Each subdivision is associated with a mode tag for designating the MBC storage mode or the SBC storage mode, where each subdivision is a memory page in the memory array.

In a second aspect, there is provided a method for storing data in a flash memory device. The method includes converting a subdivision of the flash memory device from a first storage mode to a second storage mode, the subdivision having a corresponding mode tag indicative of either the first storage mode and the second storage mode; and programming the data to one of the subdivision and an alternate subdivision. According to an embodiment of the present aspect, the first storage mode is a multiple bit per cell (MBC) storage mode and the second storage mode is a single bit per cell (SBC) storage mode, and the step of converting is executed in response to a predetermined criteria. The predetermined criteria is an MBC program erase limit, and the step of converting includes comparing a program/erase counter corresponding to the subdivision with the MBC program/erase limit. The step of programming includes programming the data to the subdivision if the program/erase counter is less than the predetermined MBC program/erase limit, and programming the data to the alternate subdivision if the program/erase counter is at least the predetermined MBC program/erase limit. The step of programming can include erasing the subdivision if the data is programmed to the alternate subdivision, setting the mode tag corresponding to the subdivision to a state indicative of the second storage mode, or resetting the program/erase counter.

In another embodiment of the present aspect, the predetermined criteria is a specific profile of the data, where the specific profile of the data includes a set of data file types. The step of programming includes programming the data to the subdivision if the data has a profile matching the specific profile, and programming the data to the alternate subdivision if the profile mismatches the specific profile. In yet a further embodiment, the subdivision includes a block, where the block has a predetermined number of pages, or the subdivision includes a page, and a predetermined number of the pages are included in a block. In another embodiment, the first storage mode is a single bit per cell (SBC) storage mode and the second storage mode is a multiple bit per cell (MBC) storage mode, and the step of converting includes comparing an SBC program/erase counter corresponding to the subdivision to a reclaim limit, and checking a state of a lock bit corresponding to the subdivision if the program/erase counter is less than the reclaim limit. The step of converting further includes changing a state of a mode tag corresponding to the subdivision if the state of the lock bit is false. The step of converting further includes setting the lock bit to true after the state of the mode tag bit is changed.

In a third aspect, there is provided a multi-mode flash memory device. The multi-mode flash memory device includes a memory array having flash memory cells for storing single bit per cell (SBC) data in an SBC storage mode and for storing multiple bit per cell (MBC) data in an MBC storage mode. According to embodiments of the present aspect, a first block of the memory array stores SBC data and a second block of the memory stores MBC data, or a first page in a block of the memory array stores SBC data and a second page in the block of the memory array stores MBC data where the first page and the second page each stores a mode tag, the mode tag having a logic state indicating a presence of SBC data or MBC data.

In a fourth aspect, there is provided a method for selectively programming data in a flash memory system in one of a multiple bit per cell (MBC) storage mode and a single bit per cell (SBC) storage mode. The method includes receiving data; determining a high reliability level or a low reliability level of the data; programming the data in the SBC storage mode if the data is determined to be high reliability; and programming the data in the MBC storage mode if the data is determined to be low reliability. In an embodiment of the present aspect, the step of programming the data in the SBC storage mode includes programming the data to selected SBC pages in a memory array of a flash memory device and setting mode tags corresponding to each of the selected SBC pages to a first state. Furthermore, the step of programming the data in the MBC storage mode includes programming the data to selected MBC pages in the memory array of the flash memory device and setting the mode tag corresponding to each of the selected MBC pages to a second state.

In a fifth aspect, there is provided a method for reading data from a flash memory system having multiple bit per cell (MBC) pages and (SBC) pages. The method includes receiving a read address for reading at least one page of the flash memory array; executing an MBC read operation at the read address if a mode tag corresponding to the at least one page is in a first logic state; and executing an SBC read operation at the read address if the mode tag corresponding to the at least one page is in a second logic state. The method includes initializing an address mapping table with mode tags corresponding to each page of the flash memory array prior to receiving the read address. In an embodiment of the present aspect, the step of initializing includes powering up the flash memory array, reading the mode tags stored in each page of the flash memory array, and storing the mode tags with logical address entries corresponding to each page of the flash memory array. Reading the mode tags includes executing an SBC read operation for reading the mode tags in each page of the flash memory array. In another embodiment, the step of receiving includes issuing an external read command from a flash controller to a flash memory device, the external read command being generated in response to the read address and the logic state of the mode tag bit corresponding to the read address. The step of executing the MBC read operation can include decoding the external read command within the flash memory device and issuing one of an internal MBC read command and an internal SBC read command.

Other aspects and features of the described embodiments will become apparent to those ordinarily skilled in the art upon review of the following description of specific embodiments of the invention in conjunction with the accompanying figures.

BRIEF DESCRIPTION OF THE DRAWINGS

The embodiments will now be described, by way of example only, with reference to the attached Figures, wherein.

DETAILED DESCRIPTION

Generally, at least some example embodiments provide a method and system for extending the life span of a flash memory device. The flash memory device is dynamically configurable to store data in the single bit per cell (SBC) storage mode or the multiple bit per cell (MBC) storage mode, such that both SBC data and MBC data co-exist within the same memory array. Such a memory device is referred to as a multi-mode flash memory device. One or more tag bits stored in each page of the memory is used to indicate the type of storage mode used for storing the data in the corresponding memory block. A controller monitors the number of program-erase cycles corresponding to each page for selectively changing the storage mode in order to maximize lifespan of the multi-mode flash memory device.

Figure 1:
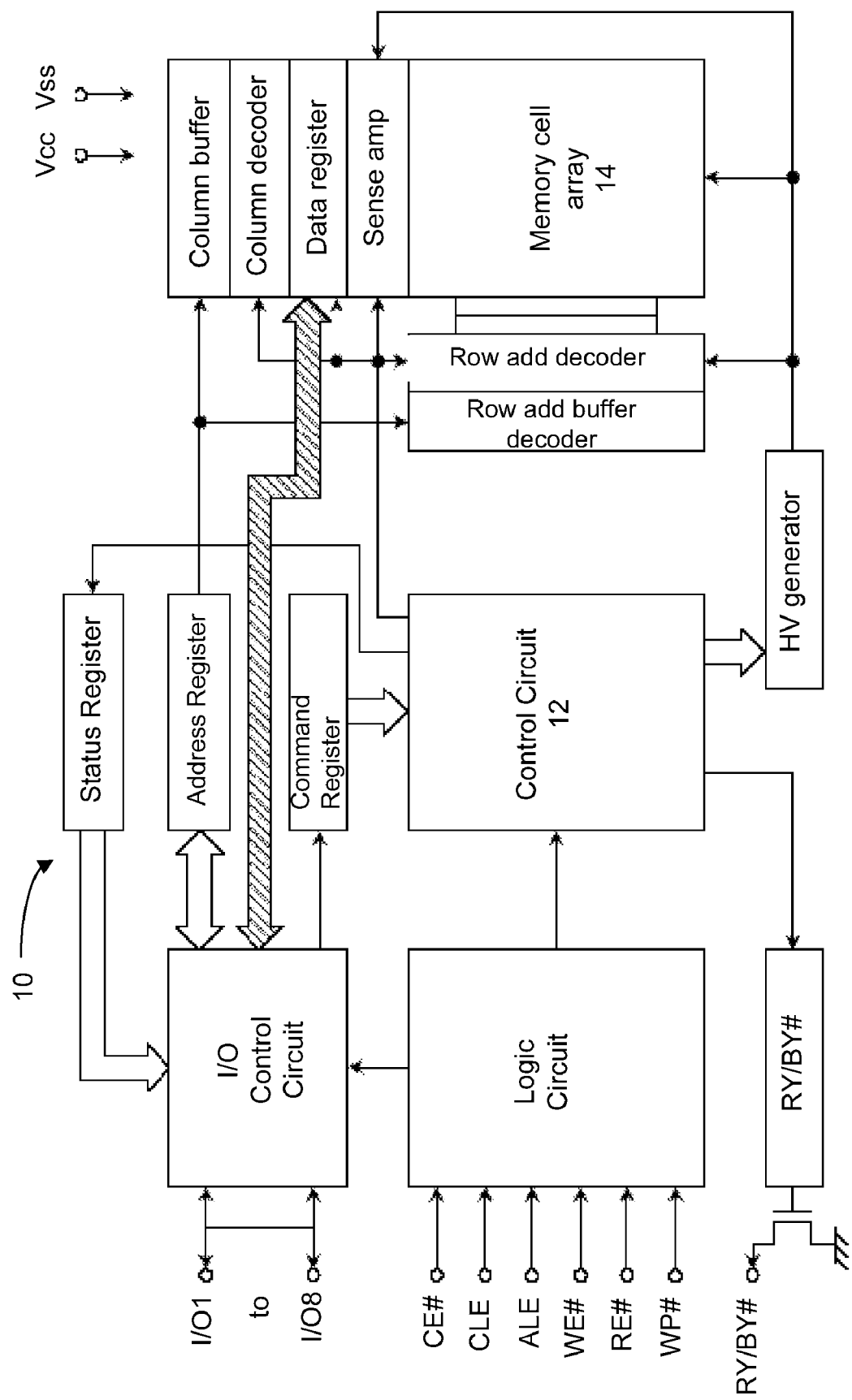
FIG. 1 is a block diagram of flash memory device of the prior art.
Figure 5:
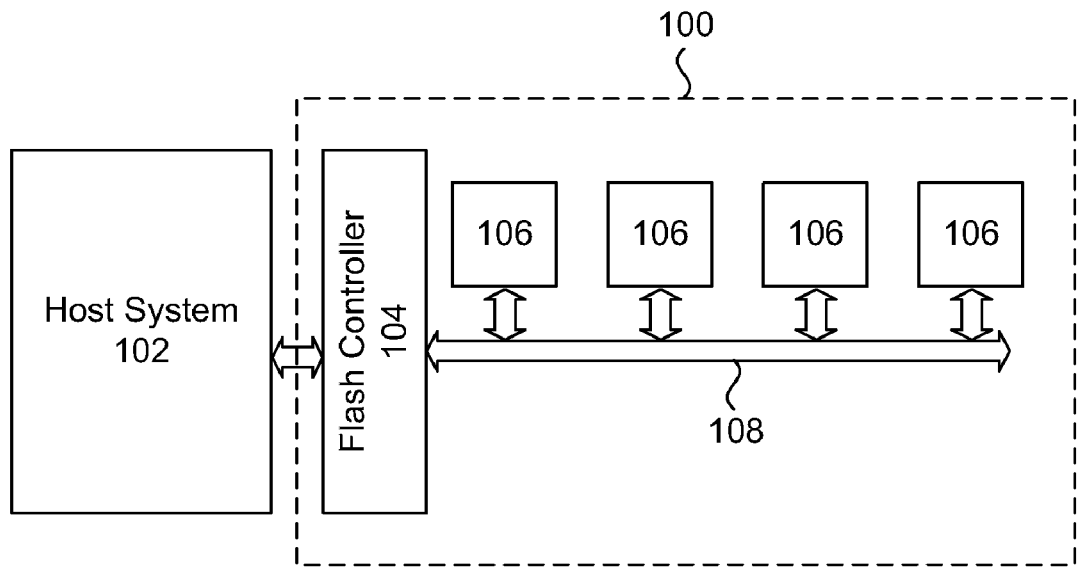
FIG. 5 is a block diagram of a multi-drop flash memory system.
Figure 6:
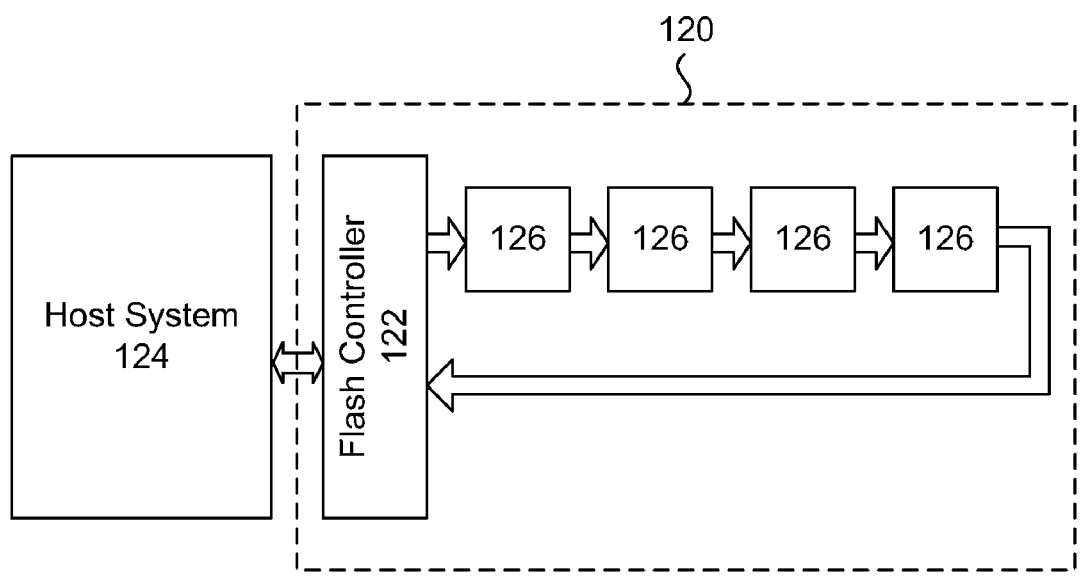
FIG. 6 is a block diagram of a serially configured flash memory system.

The presently described embodiments are applicable to single MBC flash memory devices such as the one shown in FIG. 1, and a system of MBC flash memory devices such as the ones shown in FIGS. 5 and 6.

FIG. 5 is a block diagram of a flash memory system 100 integrated with a host system 102. Flash memory system 100 includes a flash memory controller 104 in communication with host system 102, and multiple multi-mode flash memory devices 106. The host system 102 will include a processing device such as a microcontroller, microprocessor, or a computer system. The flash memory system 100 of FIG. 5 is configured to include one channel 108, where multi-mode flash memory devices 106 are coupled in parallel to channel 108. Those skilled in the art will understand that the memory system 100 can have more or less memory devices coupled to it.

Figure 2:
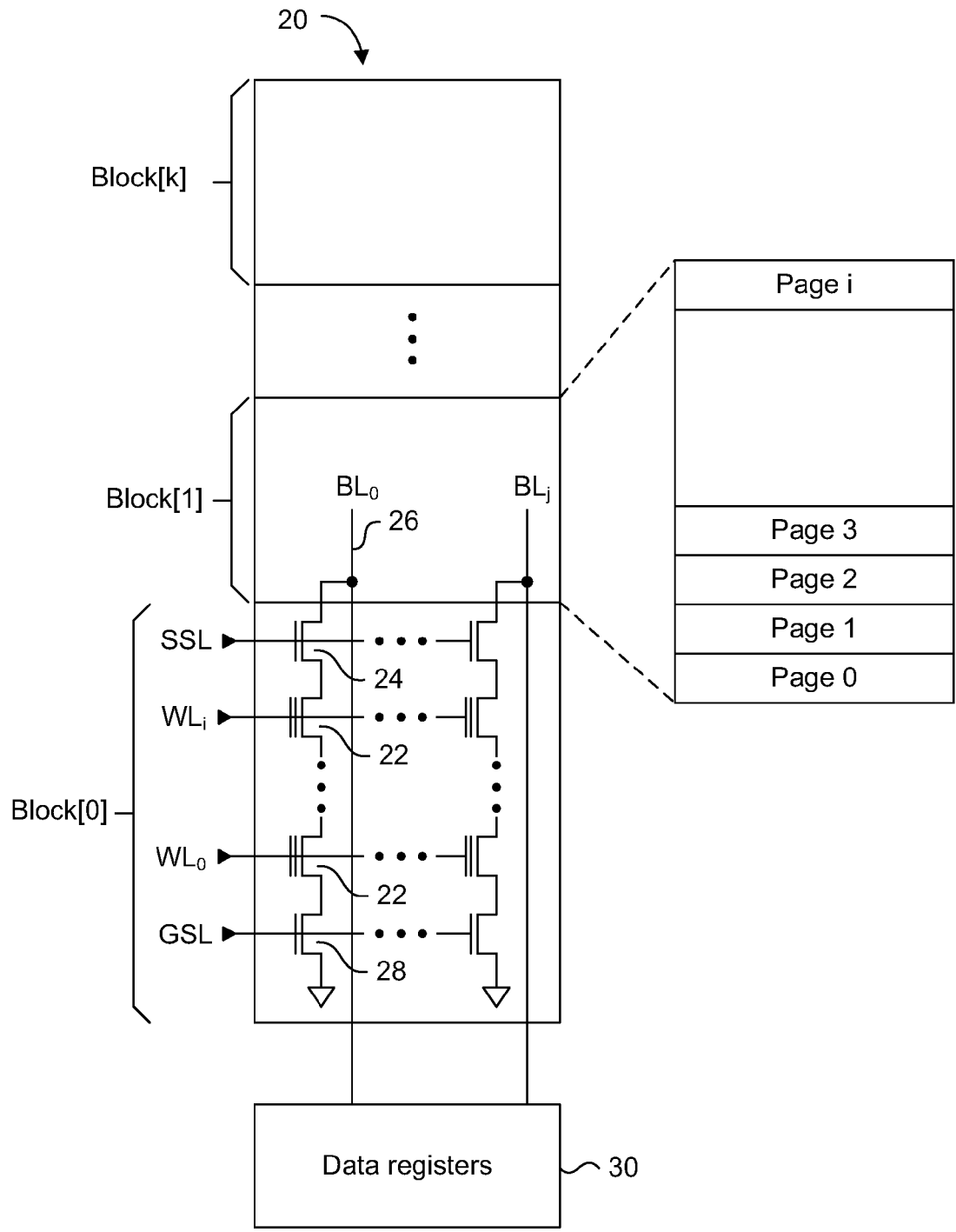
FIG. 2 is a schematic showing the organization of one memory bank of the flash memory device of FIG. 1.
Figure 3:
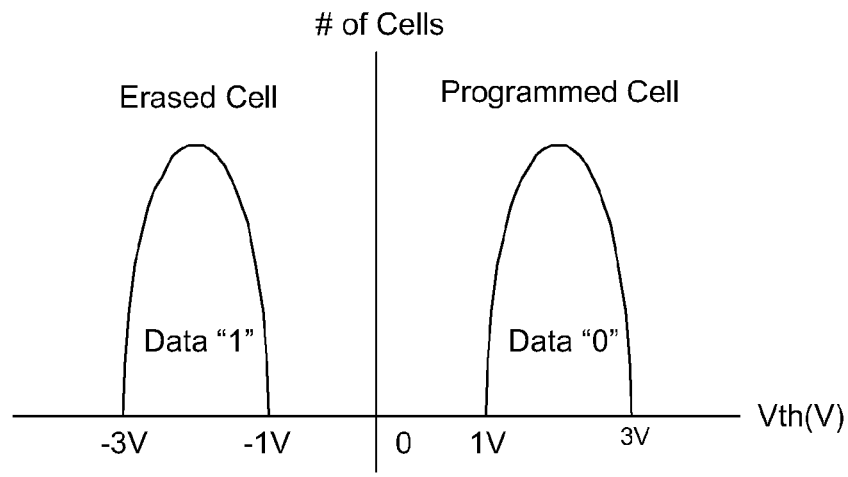
FIG. 3 is a threshold voltage (Vt) distribution graph for erased memory cells and programmed memory cells in the single bit per cell storage mode.
Figure 4:
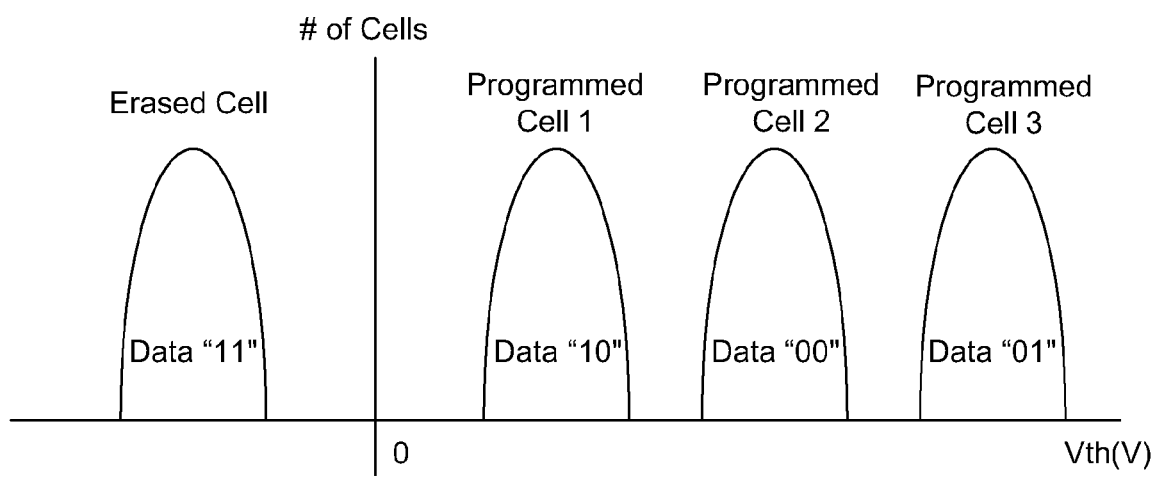
FIG. 4 is a threshold voltage (Vt) distribution graph for erased memory cells and programmed memory cells in the multiple bit per cell storage mode.

Channel 108 includes a set of common buses (not shown), which include data and control lines that are coupled to all the memory devices 106. While not shown, each memory device is enabled/disabled with a respective chip select signal provided by flash memory controller 104. The flash memory controller 104 is responsible for issuing commands and data, via the channel 108, to a selected memory device 106 based on the operation of the host system 102. Data read from the memory devices is transferred via the channel 108 back to the flash memory controller 104 and host system 102. Flash memory system 100 is generally referred to as a multi-drop configuration, in which the multi-mode flash memory devices 106 are coupled in parallel with respect to channel 108. Those skilled in the art will understand that the flash memory controller 104 can have multiple channels, each with flash memory devices 106 coupled in the multi-drop configuration. Each multi-mode flash memory device 106 is implemented as NAND flash memory devices having the bank memory organization previously shown in FIG. 2. The flash memory devices 106 can have the same capacity or different capacities.

FIG. 6 is a block diagram of a flash memory system having serially coupled memory devices. Flash memory system 120 includes a flash memory controller 122 in communication with host system 124, and four serially coupled multi-mode flash memory devices 126. Each of the four flash memory devices has an input/output circuit for facilitating operation between memory devices. An example of a such a flash memory device is described in commonly owned U.S. patent application Ser. No. 11/354,023, filed on Dec. 30, 2005, and commonly owned U.S. patent application Ser. No. 11/496,278, filed on Jul. 31, 2006, the contents of which are incorporated herein by reference.

Figure 7:
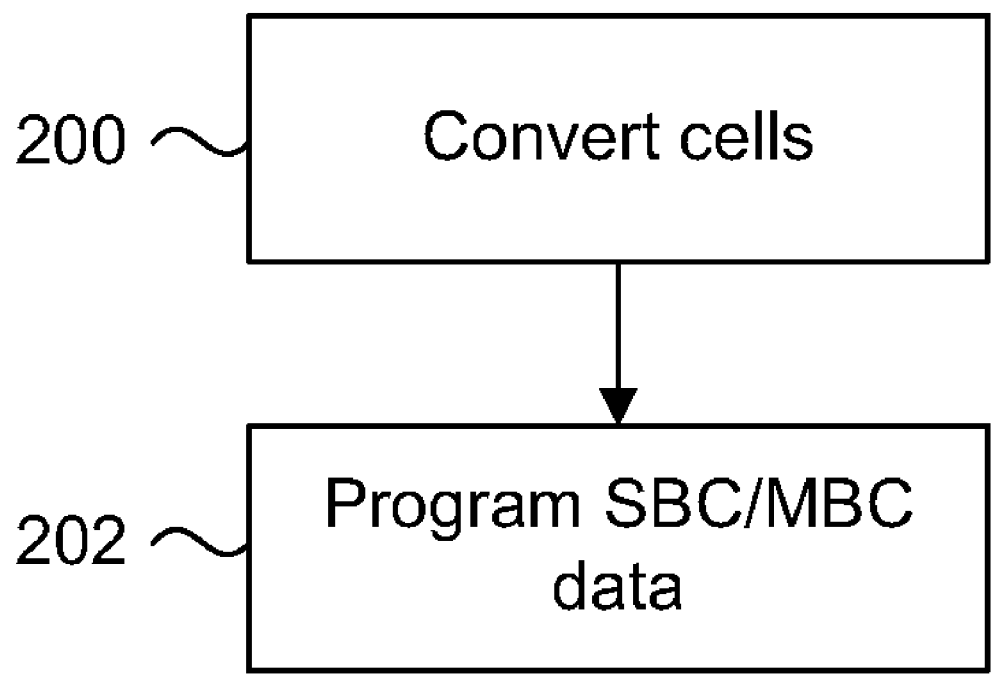
FIG. 7 is a flow chart of a method for extending the life span of a multi-mode flash memory device.

According to an embodiment, the multi-mode flash memory device is set by default to store data in the MBC storage mode. The life span of each multi-mode flash memory device is extended by executing a life span extension scheme. FIG. 7 is a flow chart illustrating a life span extension scheme.

The first step is the cell conversion 200, typically executed in response to a programming instruction. The program/erase cycles for all the subdivisions configured in the MBC storage mode are monitored, and any subdivision reaching a predetermined limit will automatically be converted to the SBC storage mode. A subdivision is the smallest unit or grouping of cells that are convertible, such as a memory block or a page, for example. This is due to the fact that any MBC storage mode subdivision reaching the predetermined limit will no longer store data reliably, but they can be used for storing data in the SBC storage mode for a set number of program/erase cycles. The cell conversion algorithm will also convert subdivisions from the SBC storage mode to the MBC storage mode, if the data stored therein is no longer retained.

Following at step 202, data is programmed according to the selected storage mode. By default all the subdivisions of the memory bank, are set to store data in the MBC storage mode. However, if the user elects to store data that requires higher storage reliability, then at least the required number of subdivisions are allocated and set for storing the data file in the SBC storage mode. The flash memory controller (104 or 122 for example) can be configured to recognize specific data file extension types as being those that require higher storage reliability. For example, executable applications with an ".exe" in the Windows™ operating system platform will be stored in the SBC storage mode while a video data file with an ".avi" extension does not require higher storage reliability. Therefore, the subdivisions configured in the SBC storage mode will have a longer life span than subdivisions configured in the MBC storage mode.

Use of any one of the above-mentioned steps of the life span extension scheme will extend the life of the multi-mode flash memory device. However, maximum life span extension is achieved when both steps are used during operation of the multi-mode flash memory device.

Figures 8A, 8B:
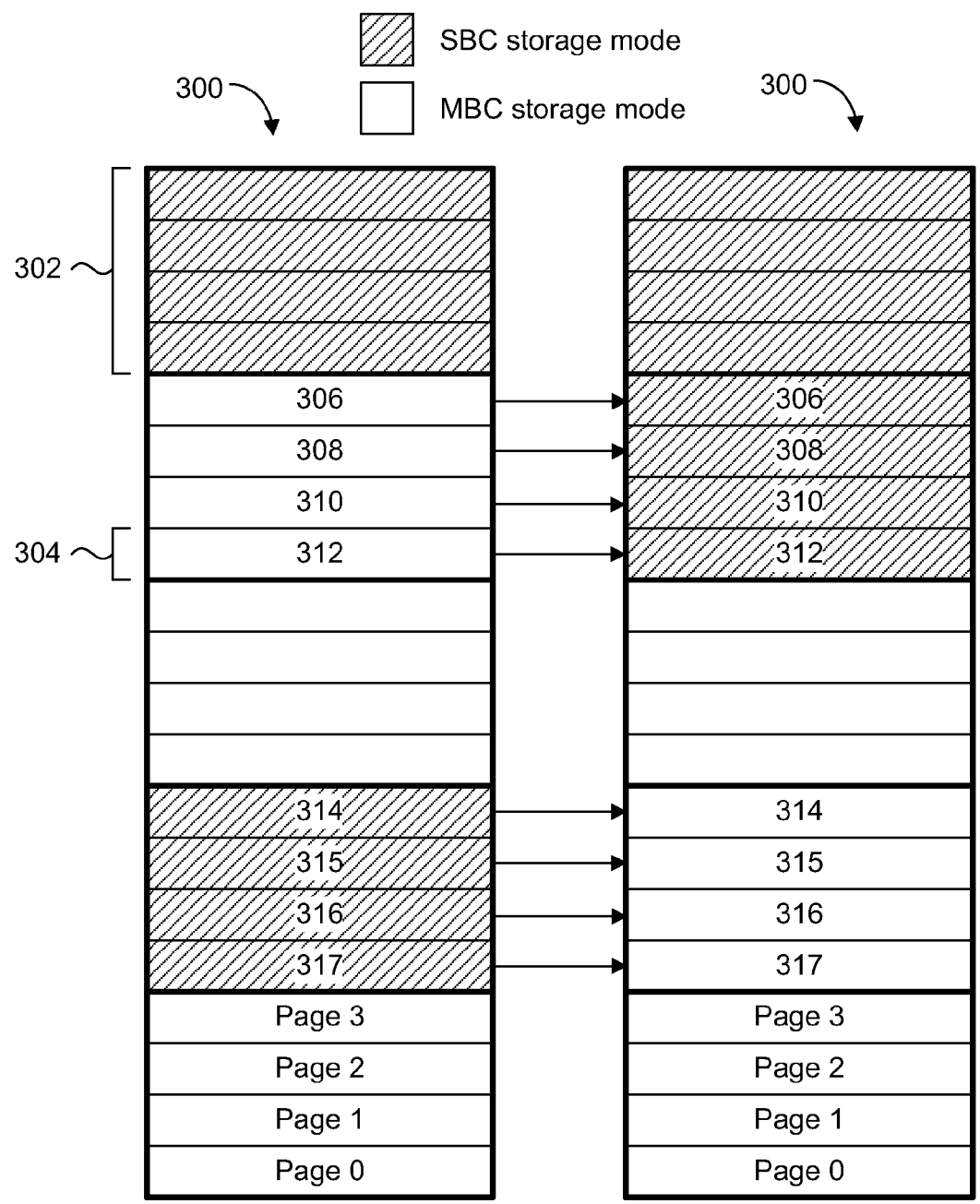
FIGS. 8a and 8b are illustrations of memory blocks converted between the MBC storage mode and the SBC storage mode.

FIGS. 8a and 8b graphically illustrate the conversion of subdivisions of the memory from the MBC storage mode to the SBC storage mode, and vice versa, where a subdivision is presently a memory block. For ease of illustration, the multi-mode flash memory device 300 of FIG. 8a consists of four memory blocks 302, each of the four memory blocks including four pages 304. It is presumed that the memory device 300 had all its blocks 302 initially set to store data in the MBC storage mode, and has been subjected to either the user or the automatic cell conversion algorithms previously described in FIG. 7. Hence, by example, the multi-mode flash memory device 300 has the configuration of SBC and MBC pages as shown in FIG. 8a, where the shaded blocks are set to store data in the SBC storage mode and the non-shaded blocks are set to store data in the MBC storage mode.

FIG. 8b illustrates the mapping of the multi-mode flash memory device 300 after pages 304 have been converted. In a first example, it has been determined that the MBC storage mode block containing pages 306, 308, 310 and 312 has reached a predetermined number of program/erase cycles. Therefore, they are converted to the SBC storage mode. The program/erase cycles are monitored for each page 304 in the block 302, and block conversion is executed when at least one of the pages reaches the predetermined number.

In a second example, it has been determined that the SBC storage mode block containing pages 314, 315, 316 and 317 are no longer storing data. This can be determined when the data therein is erased and no other data is stored therein. The number of SBC program/erase cycles for SBC pages 314, 315, 316 and 317 is checked, and because at least one of their respective SBC program/erase cycles has reached a predetermined limit, the entire block is converted back to the MBC storage mode. Specific details regarding the MBC to SBC storage mode and SBC to MBC storage mode conversion will be discussed later.

Figures 8C, 8D:
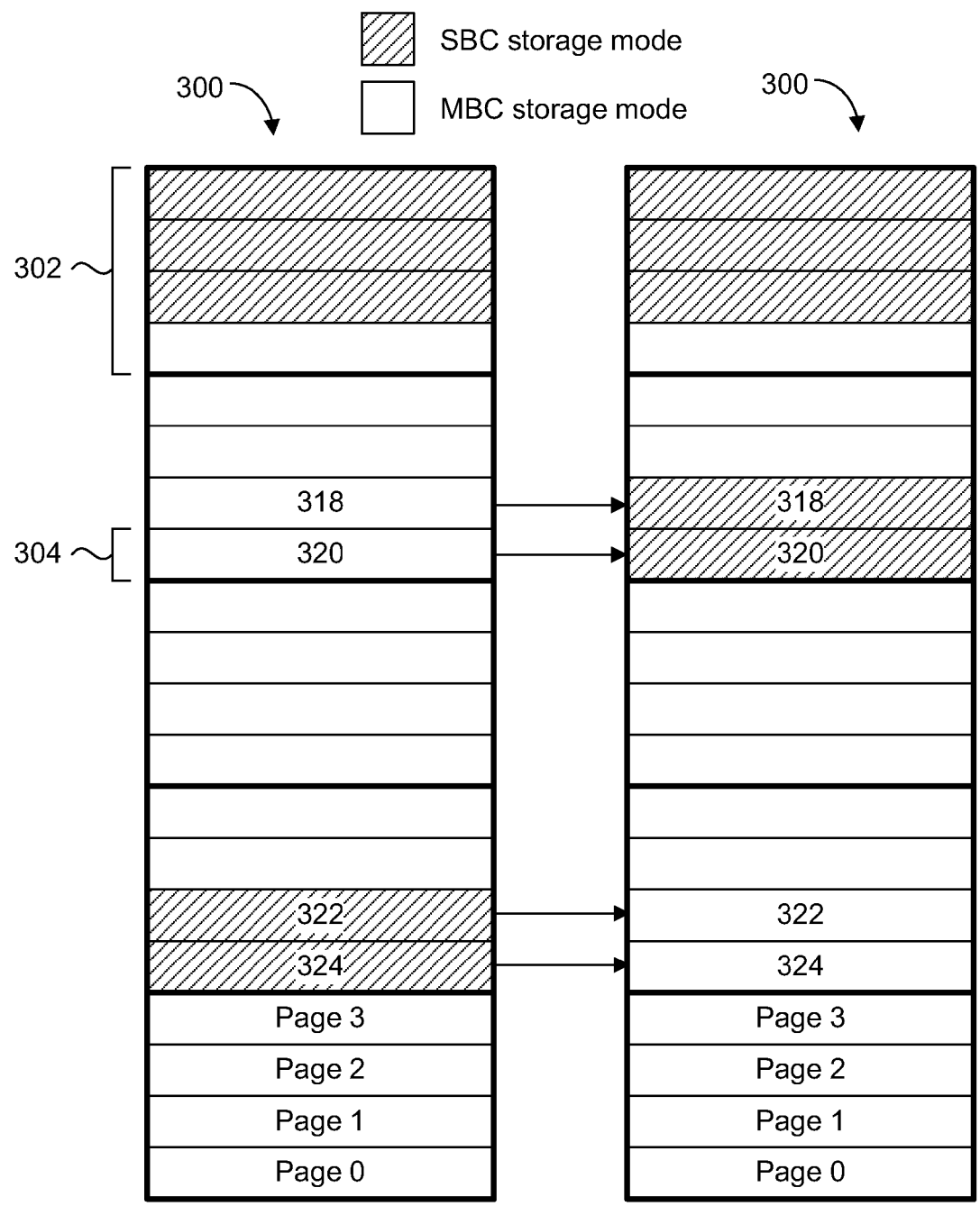
FIGS. 8c and 8d are illustrations of pages converted between the MBC storage mode and the SBC storage mode.

FIGS. 8a and 8b illustrate the conversion of block based subdivisions between the SBC storage mode and the MBC storage mode. FIGS. 8c and 8d illustrate the conversion of page based subdivisions between the SBC storage mode and the MBC storage mode. As shown in FIG. 8c, pages 318 and 320 are set to store data in the MBC storage mode, and pages 322 and 324 are set to store data in the SBC storage mode. In the first example, it is determined by monitoring the program/erase cycles that both pages 318 and 320 have reached the predetermined MBC program/erase cycle limit. Hence individual page conversion to the SBC storage mode is executed. In the second example, it is determined by monitoring the program/erase cycles that both pages 322 and 324 have reached a predetermined limit. Hence individual page conversion to the MBC storage mode is executed.

Figure 9:
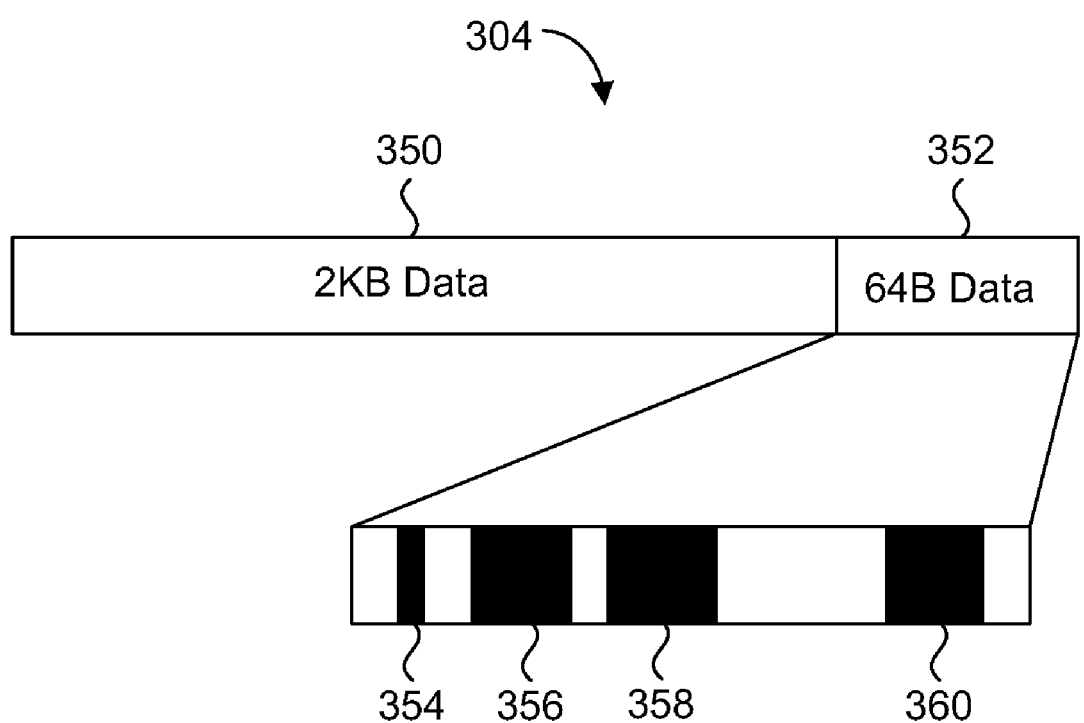
FIG. 9 is a diagrammatic illustration of allocated fields for one page of the memory array.

The determination of the storage mode of any block 302 in the memory device 300 is achieved by checking a mode tag (at least one bit) stored in one of the pages 304. This allows the memory device 300 to execute the proper programming and read operations upon the selected block 302. FIG. 9 is a diagrammatic illustration of a page 304, specifically showing its allocated fields. Page 304 includes a user data field 350 and a spare data field 352. User data field 350 stores data received from the user, while spare data field 352 is reserved for use by the flash device or flash memory controller. In the present example, user data field 350 is 2 KB in size while the spare data field 352 is 64 B in size. In the spare data field 350, one or more bits are designated as a storage mode tag 354, and several bits are designated as a program/erase cycle counter 356 for tracking the number of MBC program/erase cycles executed upon the page.

An SBC counter 358 is included to track the total number of SBC program/erase cycles executed upon the page to support SBC to MBC and subsequent MBC to SBC conversions. One example application is to program data at high speed using the SBC storage mode, and then convert to MBC storage mode later to improve memory capacity during an idle period. An optional lock bit 360 can be provided for preventing an SBC storage mode page from being converted to the MBC storage mode. Further details of this feature will be discussed later. Although memory block 302 will include any number of pages 304, any one or more of the pages 304 can be selected for storing the tag bit, the SBC counter value, the MBC counter value and the optional lock bit corresponding to the memory block 302.

The mode tag 354 is used by the multi-mode flash memory device 300 to determine the specific read, program and erase algorithm to use. As previously discussed, read and program algorithms that involve setting of specific voltage levels and timing of control signals differ for data stored in the SBC and MBC storage modes. Such differences are well known to those skilled in the art. In particular, if a subdivision (such as a block, for example) to be read or programmed has its corresponding mode tag 354 set to a specific logic state, then the flash device will execute MBC storage mode algorithms. Otherwise, the flash device will execute SBC storage mode algorithms. Execution of the algorithms specific to the SBC and MBC storage modes is governed by the command decoder and logic circuits of the multi-mode flash memory device.

In some embodiments, the multi-mode flash memory device will include all the circuits and control logic required for executing operations specific to both the SBC and MBC storage modes. It is noted that an MBC flash memory device typically includes all the circuits used by an SBC flash memory device. The main difference between dedicated MBC and SBC flash memory devices is the control circuitry and logic circuits for executing the algorithms.

Figure 10:
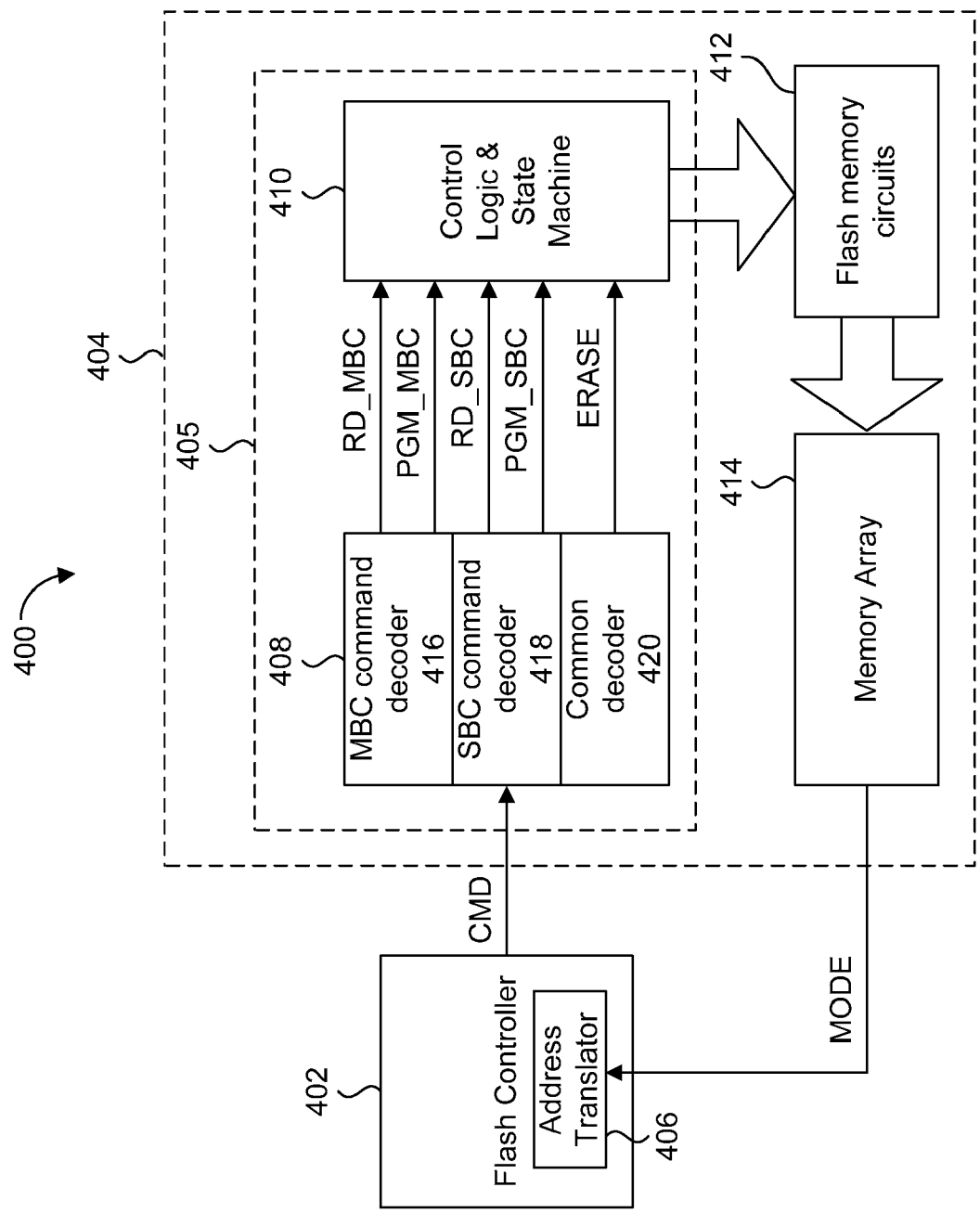
FIG. 10 is a block diagram of a flash memory system including one multi-mode flash memory device.

FIG. 10 is a block diagram of a flash memory system including one multi-mode flash memory device. Flash memory system 400 includes a flash memory controller 402 and a multi-mode flash memory device 404. While only one device 404 is shown for convenience of illustration, the system 400 can include any number of devices 404 coupled to the same channel, and the system 400 can include any number of channels. Details of the flash memory controller 402 and multi-mode flash memory device 404 will now be described.

A typical component of the flash memory controller 402 is a logical to physical address translator 406, which is responsible for mapping each logical address provided by the host system to a corresponding physical address in the multi-mode flash memory device. As will be appreciated by those skilled in the art, address mapping is used to ensure that the logical address for data consistently points to its actual physical location in the memory array if the data is moved or reprogrammed to implement wear leveling operations. Also, the translator is commonly implemented as an address mapping table. According to the present embodiment, each mode tag (MODE) of each subdivision of the multi-mode flash memory device 404 is obtained and stored with its corresponding logical address entry in the mapping table. If the subdivision is a block, then the corresponding mode tag for the logical addresses corresponding to the block is stored. Alternately, if the subdivision is a page, then the mode tag of each page is obtained and stored. Therefore, the flash memory controller 402 will issue external commands (CMD) with information relating to the type of storage mode associated with the selected addresses.

The multi-mode flash memory device 404 shown in FIG. 10 includes a multi-mode control circuit 405 consisting of command decoder 408 and control logic 410, flash memory circuitry 412 and a memory array 414. Flash memory circuitry 412 and memory array 414 have been simplified for sake of clarity, however those skilled in the art should understand that these circuit blocks include all the necessary components to ensure proper operation of the multi-mode flash memory device 404. The command decoder 408 receives an external command CMD issued by the flash memory controller 402, decodes the command, and issues a corresponding internal control command to the control logic 410. Those skilled in the art will understand that the external command CMD will include information such as the type of operation to be executed, user data to be programmed, and an address to which the data is to be written or data is to be read from. Control logic 410 is a state machine having logic for executing all standard SBC and MBC read and program operations, including any supplementary operations such as program verify operations. The control logic 410 also includes logic circuitry for executing logical functions unique to the multi-mode flash memory device, as will be described later.

The command decoder 408 includes an MBC command decoder 416, an SBC command decoder 418 and a common command decoder 420. The MBC command decoder 416 issues MBC storage mode specific commands, such as an MBC read command RD_MBC and an MBC program command PGM_MBC. The SBC command decoder 418 issues SBC storage mode specific commands, such as an SBC read command RD_SBC and an SBC program command PGM_SBC. The common decoder 420 issues commands that are not specific to memory subdivisions configured for the SBC or MBC storage modes, such as an erase command. The three sub-command decoders 416, 418 and 420 are shown as distinct circuit blocks to illustrate the categorization of the types of commands issued by the command decoder 408, and does not necessarily indicate a specific circuit or grouping of logic used for generating the commands.

Figure 11:
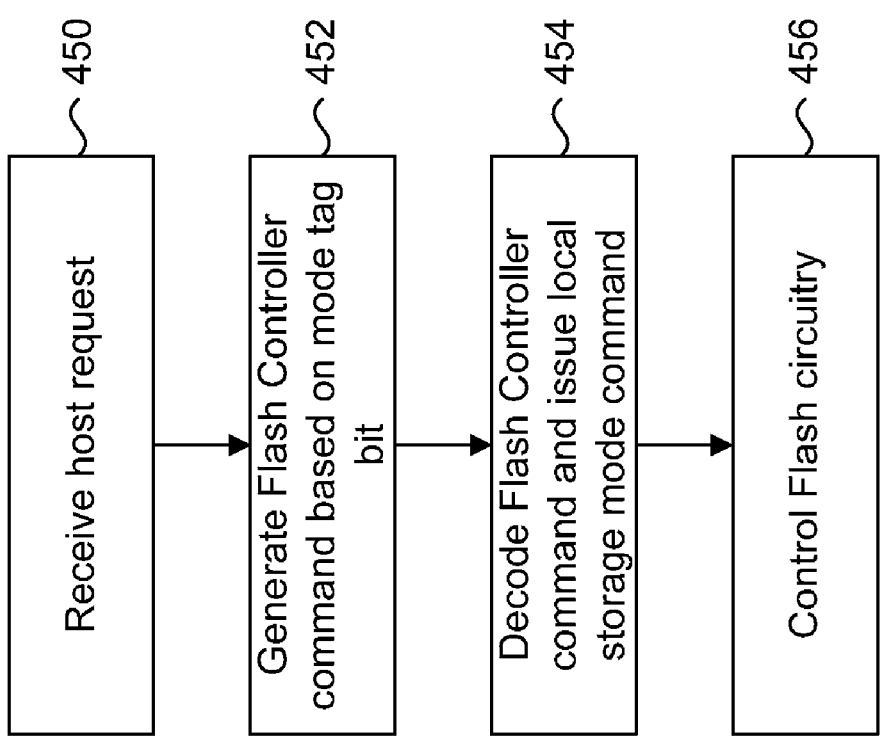
FIG. 11 is a flow chart of a method for operating the flash memory system of FIG. 10.

The general operation of flash memory system 400 is now described with reference to the flow chart of FIG. 11. Prior to carrying out of the steps of the illustrated operating method, it is assumed that the mode tag information has already been loaded into the address translator 406. Now at step 450, a host request is received, which can include a read or write request for example. The request will include the logical address for writing data to or the logical address for reading data from, the multi-mode flash memory device 404. At step 452 the flash memory controller 402 looks up the address mapping table and generates the appropriate command CMD with an indication regarding the necessary type of storage mode operation that is required (SBC vs MBC storage mode), based on the requested logical address and the state of the corresponding mode tag in the address mapping table. The CMD command received by the command decoder 408 is decoded, and either SBC storage mode or MBC storage mode read/program commands are issued at step 454 by MBC command decoder 416 or SBC command decoder 418. Of course, the CMD command can be a non storage mode specific command such as an erase operation that is issued by common command decoder 420. At step 456, the control logic 410 executes the required algorithm and controls the necessary multi-mode flash memory circuitry 412 in the proper manner.

Figure 12:
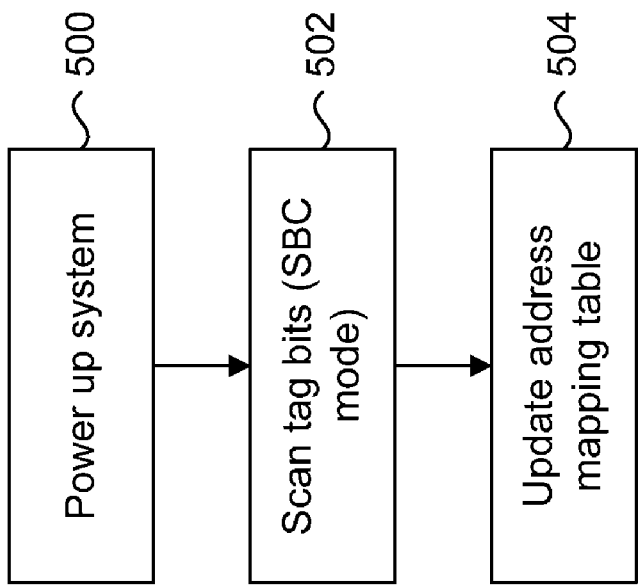
FIG. 12 is a flow chart of a method for initializing an address mapping table with mode tag information.

Prior to any operation being executed by the multi-mode flash memory device 404, the address mapping table of the flash memory controller 402 is initialized with the mode tag. This is preferably done during a time when there are no user operations being executed, such as during power up of the flash memory system 400. FIG. 12 is a flow chart illustrating a method for initializing the address mapping table. At step 500 the flash memory system 400 is powered up. Then at step 502, flash memory device 404 scans its memory array to assess the logic states of all its tag bits. This is done by executing a read operation of all the pages in the flash memory device 404, and providing only the mode tag information (MODE) to the flash memory controller 402. If an entire page of data is read out at the same time, only the tag bit is used and the remaining data read out from the pages is ignored. The address mapping table is then populated with the MODE tag data at step 504.

In order to maximize the speed and to simplify the mode tag read out process, all the pages are read out using the SBC storage mode read algorithm. More specifically, the SBC read algorithm detects the presence or absence of an erased state of the tag bit. The two binary logic states can be used to determine the SBC or MBC storage mode configuration of the subdivision (ie. block or page for example). Preferably, the flash memory device will be pre-programmed during manufacturing/testing to have all its mode tag bits set to one logic state (the erased state) indicating that data is to be programmed in the MBC storage mode. During standard operation, the flash memory device 402 will be subjected to program and erase operations, whereby eventually at least one subdivision, be it a page or block of memory, will have its mode tag changed.

Figure 13:
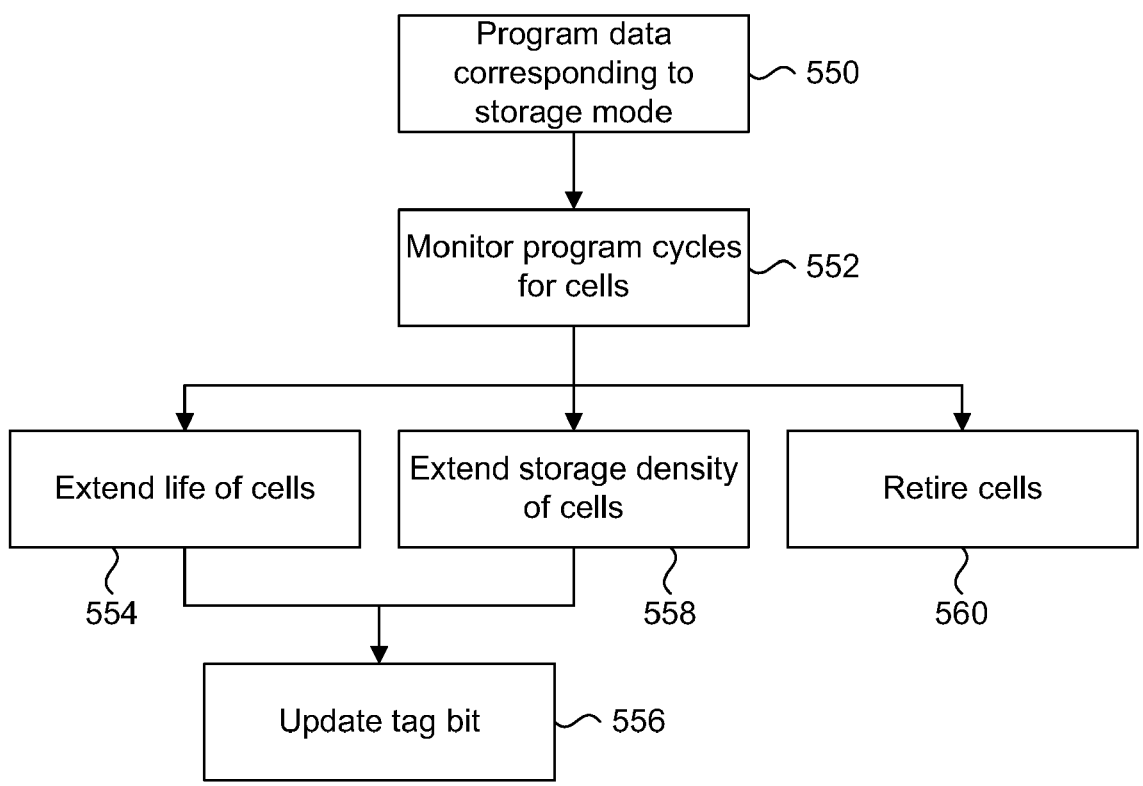
FIG. 13 is a flow chart of a method for extending the life span of a multi-mode flash memory device.

FIG. 13 is a flow chart illustrating a method for extending the life span of multi-mode flash memory device 400 by automatically changing the state of the mode tag. The method outlines specific criteria, or conditions, before a mode tag is changed. The method starts at step 550 where data is programmed to the multi-mode flash memory device. It is presumed that there is a mix of SBC storage mode subdivisions and MBC storage mode subdivisions in the memory array of the multi-mode flash memory device. Hence at step 550, an SBC or MBC programming operation will be executed.

At step 552, the number of program cycles for each subdivision of the memory array is monitored after a program/erase cycle. Alternately, the monitoring can be done just prior to a program/erase cycle. It is noted that every program operation to a subdivision of the memory is preceded by an erase operation at some point, hence the number of erase cycles or program cycles is substantially the same. The address mapping table can include a program/erase counter for each subdivision, which is initially populated with a corresponding counter value stored in the spare data field (352) of the page. The counter values can be loaded during power up of the system and programmed back to the page as data is programmed. Monitoring in step 552 includes comparing the program/erase counter for the currently programmed subdivision(s) with a predetermined limit. There are two predetermined limits that are used based on the. One limit is the SBC storage mode limit, while the other is the MBC storage mode limit. For example, MBC storage mode subdivisions will have a limit of 10,000 program/erase cycles, and the SBC storage mode subdivision will have a limit of 100,000 program/erase cycles. Before or after the programming operation has been completed, the comparison is executed. Then, one of three possible actions is taken if the applicable predetermined limit is reached.

The first possible action is to extend the life span of MBC storage mode subdivisions in step 554 by converting them to the SBC storage mode. Therefore, any data presently stored in the MBC storage mode subdivisions to be converted is either moved or programmed to available MBC storage mode subdivisions. Then the corresponding mode tag bits in the address mapping table are changed in step 556 to indicate that the subdivisions are set to the SBC storage mode. The tag bit field of the page is programmed as data is programmed to the page.

The second possible action is to reclaim SBC storage mode subdivisions in step 558 by converting them to the MBC storage mode. This is a reverse process to the one discussed in step 554. Reclamation is done under two conditions, one being that the number of SBC program/erase cycles is under a predetermined value less than the standard SBC limit, where the standard SBC limit can be 100,000 cycles. This is due to the fact that SBC memory cells programmed close to 100,000 cycles will be degraded to the point that they will not reliably store data in the MBC storage mode. Therefore, a reduced SBC to MBC reclamation limit is used. This reduced limit is selected such that the subdivision will reliably endure the standard MBC limit of 10,000 program/erase cycles. In one embodiment, the reduced SBC to MBC reclamation limit will correspond to the MBC limit. For example, if the MBC limit is 10,000 cycles, then the SBC memory cells can be converted to the MBC storage mode provided they have endured 10,000 SBC program/erase cycles or less. The second condition is that the data stored in the SBC subdivisions is no longer used, ie. the data has been erased and not reprogrammed to the same subdivisions. When a subdivision is erased, the address mapping table is updated to indicate that the subdivision is free. Once these two conditions are met, the mode tag state in the address mapping table is changed in step 556. Therefore, it is advantageous to reclaim such SBC subdivisions for high density storage.

The third possible action is to retire SBC subdivisions at step 560 when they have reached their SBC program/erase cycle limit. In this case, the subdivisions are simply mapped out and no longer used by the flash memory system. Mapping out of unusable subdivisions is a well known operation in flash memory systems. However, by this point in time, the subdivision(s) will have stored data in both the MBC and SBC storage modes, thereby maximizing the lifespan of the subdivision(s).

Figure 14:
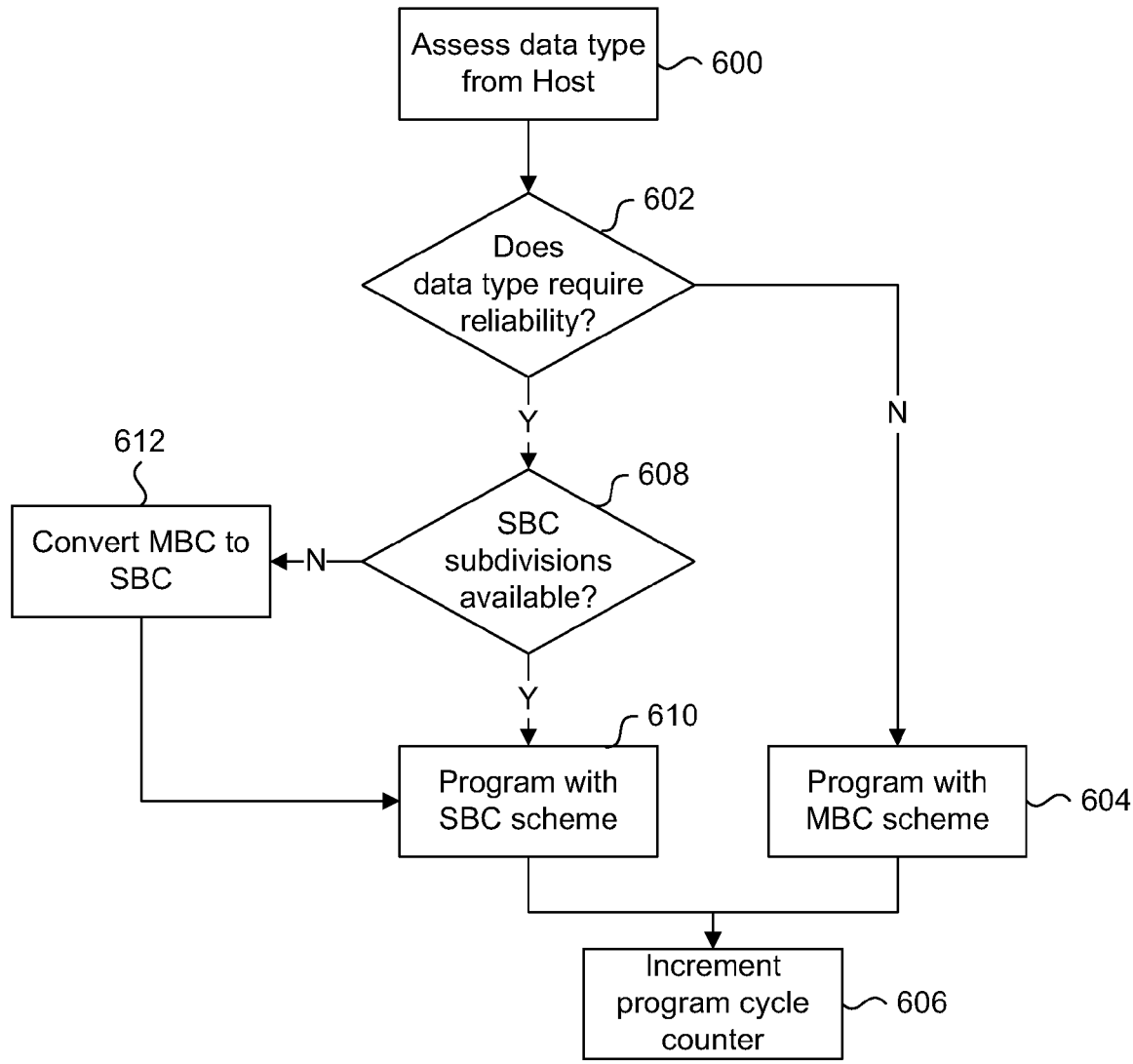
FIG. 14 is a flow chart of a method for user selectable programming of MBC and SBC storage mode data.

The previously described embodiments presume that the multi-mode flash memory has all its subdivisions configured to store data in the MBC storage mode by default. However, any MBC storage mode subdivision can be converted to the SBC storage mode by the host system FIG. 14 is a flow chart illustrating the method for host system selectable programming of MBC and SBC storage mode data. This method can be executed as a sub-routine of step 550 in the life span extension method of FIG. 13. Starting at step 600, the flash memory controller will receive a programming instruction from the host and identifies the type of data to be programmed. The type of data can be image files such as JPEG's, various application data files such as spreadsheet or text documents, and executable programs, for example. Since each file will have a specific extension, the flash memory controller will identify the specific data type. The flash memory controller then determines if the data file requires high reliability in step 602. This can be done for example, by checking a table that includes all the data types considered to require high reliability. For example, executable programs can be considered to require high reliability. It is noted that the host system can pre-select the data types requiring high reliability.

If the data type does not appear in the table, then the method proceeds to step 604, and the multi-mode flash memory device programs the data in the MBC storage mode. More specifically, the flash memory controller identifies free subdivisions having a mode tag set to the MBC storage mode from its address mapping table, and issues the appropriate MBC programming command to the multi-mode flash memory device. Upon receiving the command, the multi-mode flash memory device will proceed with internal programming operations in the manner previously described for FIG. 10. Once internal program verification has determined that the data has been successfully programmed, the program/erase counters in the address mapping table corresponding to the selected pages are incremented at step 606.

Returning to step 602, if the data type does appear in the table, then the method proceeds to step 608 where the flash memory controller checks if there are free SBC storage mode subdivisions available. If free SBC storage mode subdivisions are available, then the multi-mode flash memory device is instructed to program the data into the corresponding physical locations in the SBC storage mode at step 610. Otherwise, the necessary MBC storage mode subdivisions are converted to the SBC storage mode in step 612 by inverting the state of their mode tag. Then step 610 is executed to program the data in the SBC storage mode. Following SBC storage mode programming at step 610, the corresponding program/erase counters are incremented at step 606. Therefore, the user selectively programs data in either the MBC or SBC storage modes in the multi-mode flash memory device.

The previously discussed method categorized data file types as being either the high or low reliability type. In an alternate embodiment, the data file types can be categorized into different reliability levels. Then the host system can set a threshold for determining which reliability levels are to be categorized as high reliability data.

Figure 15:
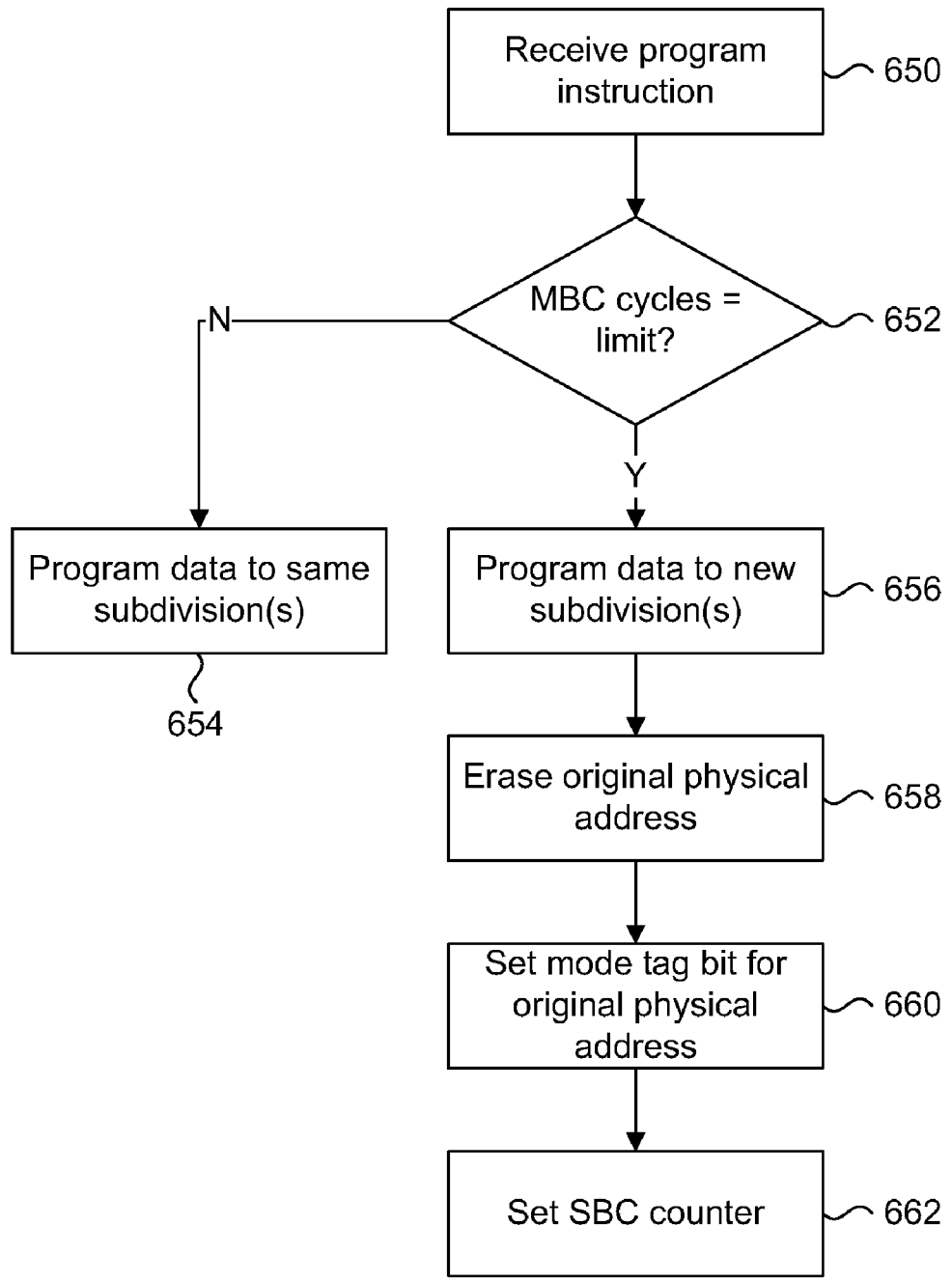
FIG. 15 is a flow chart of a method for automatically converting an MBC storage mode subdivision into an SBC storage mode subdivision.

As previously discussed, the flash memory system can automatically execute the life span extension algorithms. FIG. 15 is a flow chart illustrating one method for automatically converting an MBC storage mode subdivision into an SBC storage mode subdivision. A programming instruction is first received by the flash memory controller at step 650. For example, the programming instruction is to modify an existing file stored in the same subdivisions of the multi-mode flash memory device. The program/erase counter for the selected subdivision(s) is compared to the predetermined cycle limit for the MBC storage mode at step 652. If the counter value is less than the limit, then the data is simply programmed to the same subdivisions in the multi-mode flash memory device at step 654. Otherwise, the limit has been reached and the data is programmed to new subdivisions at step 656. Then the original subdivisions are erased at step 658 to clear the data. Finally, the states of the mode tag for the original subdivisions in the address mapping table are inverted at step 658, thereby designating them as SBC storage mode subdivisions. The subdivisions converted to the SBC storage mode will have their program/erase counters reset at step 662, since now there are a predetermined number of SBC program/erase cycles that can be executed before the subdivisions expire and can no longer be used.

An alternate modified sequence is to program the data, increment the counter and then compare the program/erase counter to the predetermined cycle limit. No further action is taken if the counter value is less than the cycle limit. Otherwise, the recently programmed data is moved, or reprogrammed, to available MBC storage mode subdivisions. The reprogramming can be done whenever the system is idle. Then the original subdivisions are erased and the mode tag bits are inverted.

The steps for programming data to SBC storage mode subdivisions is substantially the same as the one shown in FIG. 15. The MBC program/erase limit is replaced with the SBC program/erase limit, and SBC storage mode subdivisions are simply retired from use if the SBC subdivision program/erase counter is equal to the SBC program/erase limit. The SBC data is then programmed to an available SBC storage mode subdivision. If only MBC storage mode subdivisions are available, then the method of FIG. 14 is executed to convert the required MBC storage mode subdivisions to the SBC storage mode, and program the data.

In the above mentioned embodiment, one counter can be used for tracking MBC program/erase cycles, and then re-used for tracking SBC program/erase cycles when converted to the SBC storage mode. According to an optional embodiment, if the SBC subdivisions can be reclaimed, then separate SBC and MBC program/erase counters are provided.

Figure 16:
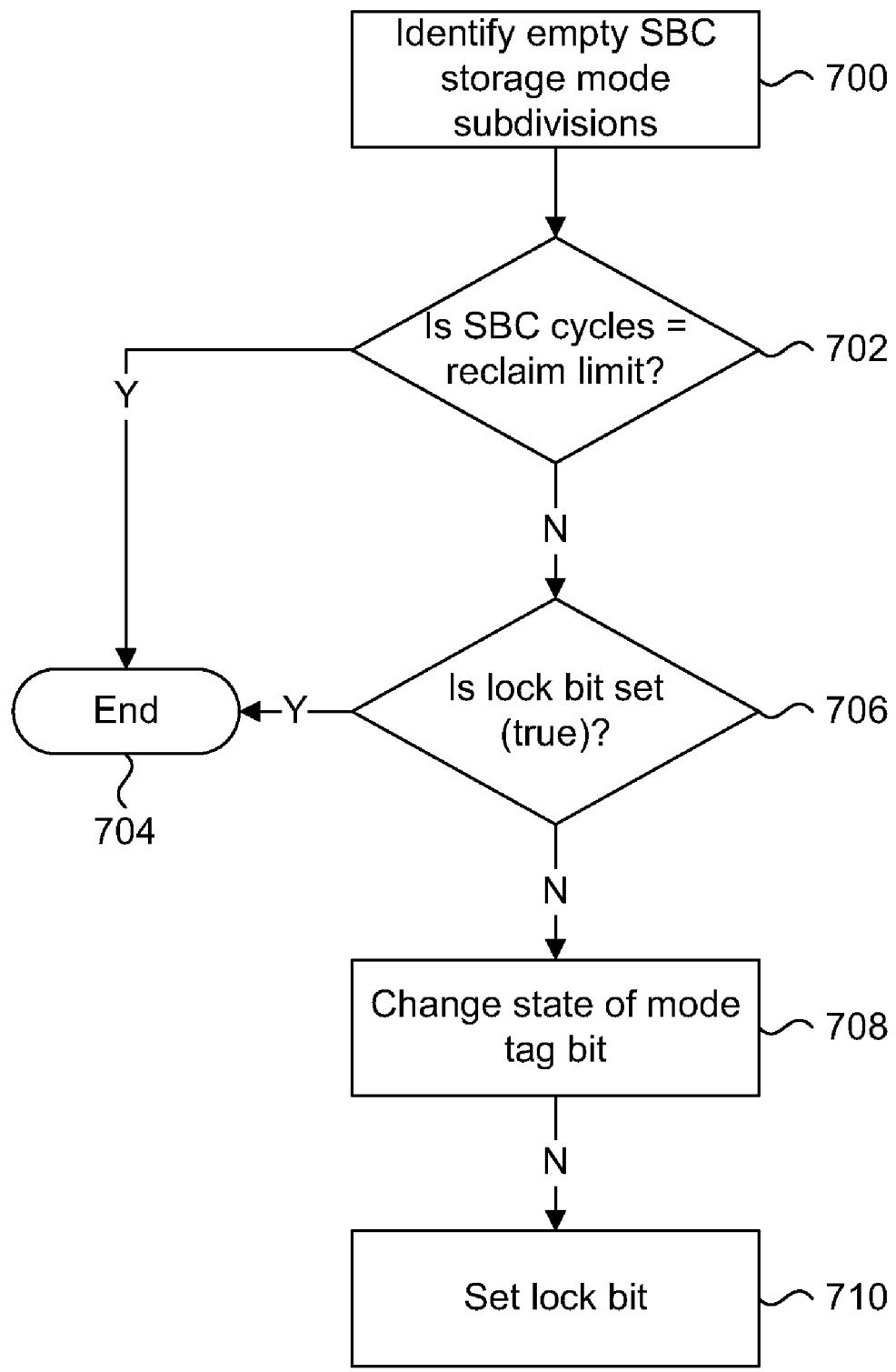
FIG. 16 is a flow chart of a method for reclaiming an SBC storage mode subdivision; and, FIG. 17 is a flow chart of a method for reading data from a multi-mode flash memory device.

The method of FIG. 16 outlines the steps for reclaiming an SBC storage mode subdivision. This method can be executed at any time while the flash memory system is active. The method starts at step 700 by identifying each SBC storage mode subdivision that is empty, ie. not intended to store any data. At step 702, the SBC program/erase counter is compared to the MBC reclaim limit. If the counter is at least the reclaim limit, then the process ends at step 704 and the SBC storage mode subdivision will not be converted to the MBC storage mode. On the other hand, if the SBC program/erase counter is less than the reclaim limit, then the status of a lock bit is checked at step 706. The lock bit being set to an active state indicates that the current SBC subdivision has been previously converted from the MBC storage mode to the SBC storage mode by the automatic conversion method of FIG. 14. In otherwords, if the SBC storage mode subdivision has already exhausted its MBC program/erase cycles, there is no reason to reclaim it from the SBC storage mode for further use as an MBC storage mode subdivision. If the lock bit is not set, then the state of its corresponding mode tag is changed at step 708. At step 710, the lock bit is set to prevent future reclaiming of this subdivision should it ever be converted back to the SBC storage mode.

Figure 17:
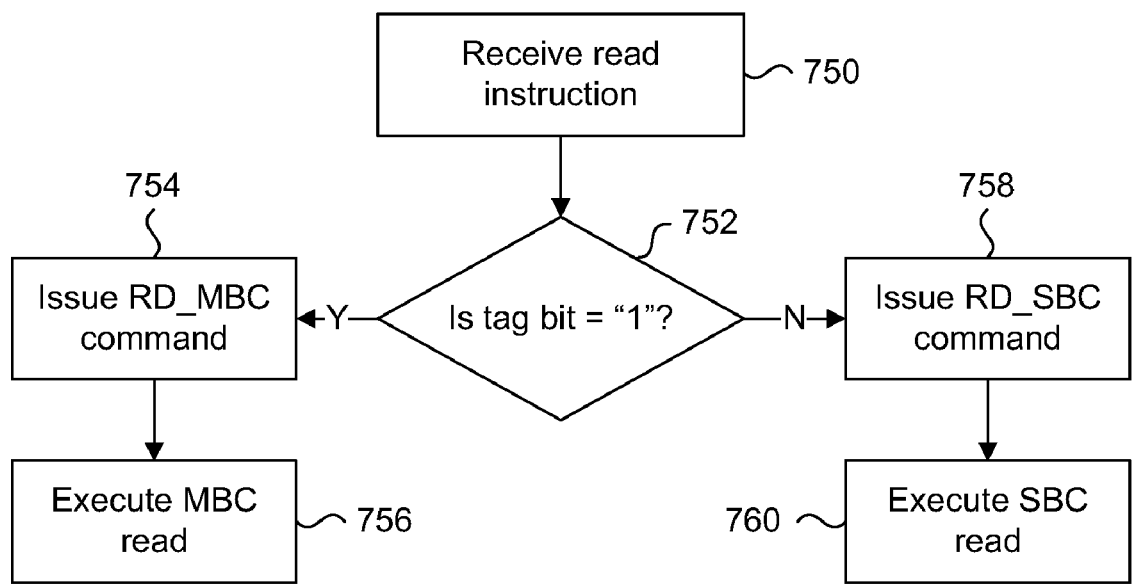

The previously discussed methods present techniques for programming data in the multi-mode flash memory device, and for extending the life span of the multi-mode flash memory device during programming operations. In these operations, the mode tag is used for determining whether data is to be programmed with the MBC or SBC storage modes, and for executing automatic conversion between the modes. Once programmed, the mode tag is used for determining the type of read operation to be executed. FIG. 17 is a flow chart outlining a method for reading data from the multi-mode flash memory device.

Starting at step 750, a read instruction is received by the flash memory controller. The read instruction will include a logical address of the desired data. The flash memory controller will then check its address mapping table for the state of the mode tag bits corresponding to the logical address in step 752. If the state of the mode tag is a first state, such as a logic "1" for example, then a MBC storage mode read command CMD is generated and provided to the multi-mode flash memory device. In response, the multi-mode flash memory device will decode the command and issue an RD_MBC command at step 754. The MBC read is then executed at step 756. Otherwise, the multi-mode flash memory device will issue an RD_SBC command at step 758 and an SBC read is then executed at step 760. Regardless of the specific type of read command, the data will be read out from the memory array and provided back to the flash memory controller. Therefore, both data programmed in the SBC and MBC storage modes can be accessed by the user from the same multi-mode flash memory device.

In all the previously discussed embodiments, the selective MBC or SBC processes executed by the flash memory controller and the multi-mode flash memory device are done transparently to the user. There are no additional instructions, or modification of instructions required from the user, as all determination of SBC/MBC storage mode operations are done by the flash memory controller. Accordingly, there is minimal overhead required for implementing the presently described flash memory system with a host system.

Therefore, the previously described embodiments of the multi-mode flash memory device can be controlled to selectively program data in the SBC storage mode or the MBC storage mode, such that data programmed in both storage modes co-exist within the same memory array at the same time. The selective programming can be done under user control based on the type of data being programmed, and/or automatically through preset algorithms. By storing data with both types of storage modes, the life span of the multi-mode flash memory device is extended over flash memory devices dedicated to storing data only in the MBC storage mode. The subdivisions referred to in the previously described embodiments can be memory banks, memory blocks or pages.

In the preceding description, for purposes of explanation, numerous details are set forth in order to provide a thorough understanding of the embodiments. However, it will be apparent to one skilled in the art that these specific details are not required in order to practice the embodiments. In other instances, well-known electrical structures and circuits are shown in block diagram form in order not to obscure the aspects of the embodiments. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A method for extending life span of a NAND flash memory device, comprising:
   receiving a programming instruction to program data in a subdivision configured in a first storage mode;
   programming the data to a new subdivision if program/erase cycles corresponding to the subdivision is reached; and,
   converting the subdivision to a second storage mode.

2. The method of claim 1, wherein programming the data to the new subdivision is carried out before converting.

3. The method of claim 1, wherein programming includes comparing the program/erase cycles corresponding to the subdivision to a predetermined limit.

4. The method of claim 3, wherein programming includes programming the data to the subdivision if the program/erase cycles corresponding to the subdivision is less than the predetermined limit.

5. The method of claim 1, wherein converting includes changing storage mode data corresponding to the subdivision from the first storage mode to the second storage mode.

6. The method of claim 5, wherein the storage mode data includes a mode tag bit for identifying one of the first storage mode and the second storage mode of the subdivision.

7. The method of claim 6, wherein the mode tag bit is stored in an address mapping table.

8. The method of claim 6, wherein the mode tag bit is stored in the subdivision.

9. The method of claim 1, wherein the first storage mode is a multiple bit per cell (MBC) storage mode and the second storage mode is a single bit per cell (SBC) storage mode.

10. The method of claim 9, wherein converting includes resetting a counter for tracking SBC program/erase cycles of the subdivision.

11. The method of claim 9, further including reclaiming the subdivision configured for SBC storage for MBC storage.

12. The method of claim 11, wherein reclaiming includes determining if the subdivision can be reclaimed.

13. The method of claim 12, wherein determining includes comparing SBC program/erase cycles corresponding to the subdivision to a reclaim limit, and ending reclaiming if the SBC program/erase cycles reaches the reclaim limit.

14. The method of claim 13, further including determining a status of a lock bit corresponding to the subdivision if the SBC program/erase cycles corresponding to the subdivision is less than the reclaim limit.

15. The method of claim 14, further including changing storage mode data corresponding to the subdivision from the SBC storage mode to the MBC storage mode if the lock bit is not set.

16. The method of claim 15, further including setting the lock bit corresponding to the subdivision.

17. The method of claim 1, wherein the first storage mode is a single bit per cell (SBC) storage mode and the second storage mode is a multiple bit per cell (MBC) storage mode.

18. The method of claim 17, wherein converting the subdivision from the MBC storage mode to the SBC storage mode is prevented if a lock bit corresponding to the subdivision is set.

19. A method for storing data in a NAND flash memory device in either a first storage mode or a second storage mode, comprising:
   a) receiving a command for programming the data in the second storage mode;
   b) converting at least one subdivision of the NAND flash memory device from the first storage mode to the second storage mode when there are no available subdivisions configured to store the data in the second storage mode; and
   c) programming the data to the at least one subdivision configured in the second storage mode.

20. The method of claim 19, wherein the NAND flash memory device is powered up to include the at least one subdivision configured in the first storage mode, and internal flash operations are executed in response to the command after the NAND flash memory device is powered up.

21. The method of claim 19, wherein the first storage mode is a multiple bit per cell (MBC) storage mode and the second storage mode is a single bit per cell (SBC) storage mode.

22. The method of claim 19, wherein programming further includes setting a mode tag corresponding to the at least one subdivision to a state indicative of the second storage mode.

23. The method of claim 19, wherein converting includes resetting a program/erase counter corresponding to the at least one subdivision.

24. The method of claim 19, wherein the command for programming the data in the second storage mode is provided in response to a predetermined criteria, the predetermined criteria being a specific profile of the data that includes a set of data file types.

25. The method of claim 19, wherein the at least one subdivision includes a block, the block having a predetermined number of pages.

26. The method of claim 19, wherein the at least one subdivision includes a page, and a predetermined number of the pages are included in a block.

27. The method of claim 19, wherein the first storage mode is a single bit per cell (SBC) storage mode and the second storage mode is a multiple bit per cell (MBC) storage mode.

28. The method of claim 27, wherein converting includes comparing an SBC program/erase counter corresponding to the at least one subdivision to a reclaim limit, and determining that the program/erase counter is less than the reclaim limit.

29. The method of claim 28, wherein converting further includes checking a state of a lock bit corresponding to the at least one subdivision if the SBC program/erase counter is less than the reclaim limit where the state of the lock bit indicates if the at least one subdivision has been previously converted from the MBC storage mode to the SBC storage mode, the at least one subdivision being converted from the MBC storage mode to the SBC storage mode if the state of the lock bit is false.

30. The method of claim 29, wherein the at least one subdivision is converted from the MBC storage mode to the SBC storage mode by changing a state of a mode tag corresponding to the at least one subdivision if the state of the lock bit is false, and setting the lock bit to true after the state of the mode tag is changed.

* * * * *